United States Patent
Apanius et al.

(10) Patent No.: US 9,765,200 B2
(45) Date of Patent: *Sep. 19, 2017

(54) POLYMER COMPOSITION FOR MICROELECTRONIC ASSEMBLY

(71) Applicant: Promerus, LLC, Brecksville, OH (US)

(72) Inventors: Christopher Apanius, Moreland Hill, OH (US); Andrew Bell, Lakewood, OH (US); Leah Langsdorf, Akron, OH (US); W. C. Peter Tsang, Broadview Heights, OH (US)

(73) Assignee: PROMERUS, LLC, Brecksville, OH (US)

(*) Notice: Subject to any disclaimer, the term of this patent is extended or adjusted under 35 U.S.C. 154(b) by 383 days.

This patent is subject to a terminal disclaimer.

(21) Appl. No.: 13/965,287

(22) Filed: Aug. 13, 2013

(65) Prior Publication Data

US 2013/0327815 A1 Dec. 12, 2013

Related U.S. Application Data

(63) Continuation of application No. 13/299,710, filed on Nov. 18, 2011, now Pat. No. 8,535,454.

(60) Provisional application No. 61/416,508, filed on Nov. 23, 2010.

(51) Int. Cl.
| | |
|---|---|
| *C08K 5/09* | (2006.01) |
| *C08L 69/00* | (2006.01) |
| *H01L 23/29* | (2006.01) |
| *H05K 13/00* | (2006.01) |
| *H05K 13/04* | (2006.01) |

(52) U.S. Cl.
CPC ............... *C08K 5/09* (2013.01); *C08L 69/00* (2013.01); *H01L 23/293* (2013.01); *H05K 13/0046* (2013.01); *H05K 13/0465* (2013.01); *H01L 2924/0002* (2013.01); *H01L 2924/01322* (2013.01)

(58) Field of Classification Search
CPC .......... C08L 69/00; H01L 23/293; C08K 5/09
USPC ....................................................... 524/284
See application file for complete search history.

(56) References Cited

U.S. PATENT DOCUMENTS

| | | | |
|---|---|---|---|
| 5,128,746 A | 7/1992 | Pennisi et al. | |
| 5,177,134 A | 1/1993 | Mullen, III et al. | |
| 6,180,696 B1 | 1/2001 | Wong et al. | |
| 6,498,260 B2 | 12/2002 | Wang et al. | |
| 6,570,029 B2 | 5/2003 | Wang et al. | |
| 8,169,090 B2 | 5/2012 | Katsurayama et al. | |
| 8,319,350 B2 | 11/2012 | Katsurayama et al. | |
| 8,575,248 B2 * | 11/2013 | Apanius ................ | B23K 35/26 148/23 |
| 2003/0099844 A1 * | 5/2003 | Hanahata ............. | C09D 183/04 428/447 |
| 2009/0166897 A1 | 7/2009 | Katsurayama et al. | |
| 2009/0294515 A1 | 12/2009 | Prack et al. | |
| 2010/0203307 A1 | 8/2010 | Komiyatani et al. | |
| 2011/0006419 A1 | 1/2011 | Hirano | |

FOREIGN PATENT DOCUMENTS

| | | |
|---|---|---|
| WO | WO 2007/058969 A2 | 5/2007 |
| WO | WO 2012/019092 A1 | 2/2012 |

OTHER PUBLICATIONS

Agarwal et al. (Use of electrospinning technique for biomedical applications, Polymer 49 (2008) 5603-5621).*

* cited by examiner

*Primary Examiner* — Weiping Zhu
(74) *Attorney, Agent, or Firm* — Balaram Gupta

(57) ABSTRACT

Embodiments in accordance with the present invention encompass polymer compositions that are useful in the assembly of microelectronic components onto a variety of substrate materials. Such polymer compositions providing for both holding the microelectronic components at desired positions on a substrate, providing fluxing for the solder bonding of such components to the substrate and remaining in place as an underfill for such components.

16 Claims, No Drawings

POLYMER COMPOSITION FOR MICROELECTRONIC ASSEMBLY

CROSS REFERENCE TO RELATED APPLICATIONS

This application is a continuation of U.S. application Ser. No. 13/299,710 filed Nov. 18, 2011, now allowed, which claims the benefit of U.S. Provisional Application No. 61/416,508, filed Nov. 23, 2010, both of which are incorporated herein by reference in their entirety.

TECHNICAL FIELD

Embodiments in accordance with the present invention relate generally to polymer compositions that are useful for mounting microelectronic components to a substrate and more specifically to a polymer composition that provides for both holding microelectronic components at desired positions on a substrate, providing fluxing for the solder bonding of such components to the substrate and remaining in place as an underfill.

BACKGROUND

While assembled electronic circuitry has been dramatically reduced in size, the use of soldering as a method for forming both an electrical and fixable attachment of electronic components to a substrate has remained quite prevalent. However, such attachments require that the variety of components be held in desired positions prior to completing the aforementioned solder attachments, and post electrical underfill connection. An underfill connection can increase the thermal fatigue life of a solder ball connection, environmentally protect the connection, and provide greater mechanical shock and robustness to the assembled electronic circuitry.

A number of solutions for temporarily holding components in such desired positions have been developed and used with some success. For example, a tack agent can be used to secure such components to the substrate while solder bond or solder ball connections are made through the application of heat. After such temporary connections are made, the tack agent can remain as a contaminant or the assembly subjected to an extra processing step designed to remove such contamination. For some of the aforementioned solutions, a fluxing agent is provided separately from the tack agent, for example by applying such fluxing agent in a distinct application step, separate from the application of the tack agent. In other solutions the fluxing agent is provided in a combination with the tack agent, for example where a solder paste is used as the tack agent and fluxing agent is either added thereto or prereacted therewith.

In still other solutions, (see, U.S. Pat. No. 5,177,134 or US Published Application No. 2009/0294515, the '134 patent and the '515 application, respectively) a tack agent and fluxing agent are admixed where upon soldering, the tack agent either volatilizes or decomposes. However it has been found that where the tack agent is either volatized or decomposed at or above solder reflow temperatures, as each of the above teaches, either solder reflow is limited, significant contamination from the tack agent can remain or specialized process equipment is required.

Therefore new solutions that can provide a single material that holds components in desired positions prior to completing solder attachments (i.e., performs as a tack agent), provide for any fluxing that might be desired (i.e., performs as a fluxing agent) and also provides a post electrical connection underfill would be desirable. Further it would be advantageous if such solutions would eliminate the need for specialized equipment, as described above, and reduce or eliminate the problems with achieving desirable solder reflow and/or associated with any contamination that might result therefrom.

DETAILED DESCRIPTION

Exemplary embodiments in accordance with the present invention will be described with reference to the Examples and Claims provided hereinafter. Various modifications, adaptations or variations of such exemplary embodiments described herein may become apparent to those skilled in the art as such are disclosed. It will be understood that all such modifications, adaptations or variations that rely upon the teachings of the present invention, and through which these teachings have advanced the art, are considered to be within the scope and spirit of the present invention.

As used herein, the articles "a," "an," and "the" include plural referents unless otherwise expressly and unequivocally limited to one referent.

As used herein, the terms "group" or "groups" when used in relation to a chemical compound and/or representative chemical structure/formula, mean an arrangement of one or more atoms.

As used herein, molecular weight values of polymers, such as weight average molecular weights ($M_w$) and number average molecular weights ($M_n$) are determined by gel permeation chromatography using polystyrene standards.

As used herein, polydispersity index (PDI) values represent a ratio of the weight average molecular weight ($M_w$) to the number average molecular weight ($M_n$) of the polymer (i.e., $M_w/M_n$).

As used herein, and unless otherwise stated, polymer glass transition temperature ($T_g$) values are determined by differential scanning calorimetry in accordance with American Society for Testing and Materials (ASTM) method number D3418.

As used herein, and unless otherwise stated, the polymer decomposition temperature ($T_d$) is the temperature, determined by thermogravimetric analysis at a heating rate of 10° C./minute, where a specific weight percent (wt %) of a polymer has determined to have decomposed. The terms $T_{d5}$, $T_{d50}$ and $T_{d95}$ indicate the temperatures at which 5 wt %, 50 wt % and 95 wt % has decomposed.

Unless otherwise indicated, all ranges or ratios disclosed herein are to be understood to encompass any and all subranges or subratios subsumed therein. For example, a stated range or ratio of "1 to 10" should be considered to include any and all subranges between (and inclusive of) the minimum value of 1 and the maximum value of 10; that is, all subranges or subratios beginning with a minimum value of 1 or more and ending with a maximum value of 10 or less, such as but not limited to, 1 to 6.1, 3.5 to 7.8, and 5.5 to 10.

In the operating examples, and unless otherwise indicated, all numbers used in the specification and claims expressing quantities of ingredients, reaction conditions, and so forth are to be understood as being modified in all instances by the term "about" to take into account the uncertainties associated with determining such values.

Polymers such as poly(propylene carbonates) are well known, and both the previously mentioned '134 patent and '515 application teach that such polymers are effective tack agents. However, such poly(propylene carbonates) are also known to be subject to thermal decomposition at temperatures in the range of 200° C. to 280° C., and thus can be problematic where a material capable of being a tack agent, a fluxing agent and providing underfill is desired. This being especially true where a lead-free solder material is to be employed for making the solder interconnections since such lead-free solders generally have a melting range 30 to 40° C. higher than commonly used lead-containing solders. For example, the commonly used Sn60Pb40 solder alloy has a melting range from 183 to 190° C. while Sn99.3Cu0.7, used in the examples provided hereinbelow, melts at 227° C.

Some polymer embodiments in accordance with the present invention encompass polymers formed from stereospecific norbornane diol and/or dimethanol monomers while other polymer embodiments encompass polymers derived from appropriate alkylene carbonate monomers and the aforementioned norbornane diol and/or dimethanol monomers. Advantageously, some such polymer embodiments have a $T_{d50}$ greater than 280° C. while other such polymer embodiments have a $T_{d50}$ greater than 310° C. and still other such polymer embodiments have a $T_{d50}$ greater than 340° C. In addition, some such norbornane diol and/or dimethanol containing polymer embodiments have molecular weights ($M_w$) in the range of from 5,000 to 300,000, other such embodiments have a $M_w$ range of from 25,000 to 200,000 and still other such embodiments from 40,000 to 185,000.

Some of the aforementioned stereospecific norbornane diol and/or dimethanol monomers are represented by and selected from the following Formulae A, B or C:

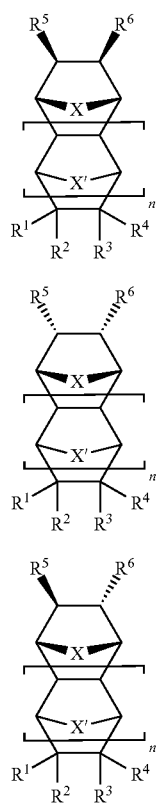

Where for each of Formulae A, B and C, n is independently 0, 1 or 2, each of $R^1$, $R^2$, $R^3$ and $R^4$ is independently selected from hydrogen or a hydrocarbyl group containing, without limitation, from 1 to 25 carbon atoms, each of $R^5$ and $R^6$ are independently selected from —$(CH_2)_p$—OH, where p is 0, 1, 2 or 3, and each of X and X' is independently selected from —$CH_2$—, —$CH_2$—$CH_2$— and —O—, where each X' is, if present, oriented the same or opposite the orientation of X. For some embodiments in accordance with the present invention, p is 1, 2 or 3 for at least one of $R^5$ and $R^6$.

As used herein the term "hydrocarbyl" and similar terms, such as "hydrocarbyl group" means a radical of a group that contains carbon and optionally hydrogen, non-limiting examples being alkyl, cycloalkyl, polycycloalkyl, aryl, aralkyl, alkaryl, alkenyl, cycloalkenyl, polycycloalkenyl, alkynyl, cycloalkynyl and polycycloalkynyl. The term "halohydrocarbyl" as used herein means a hydrocarbyl group where at least one hydrogen covalently bonded to a carbon has been replaced by a halogen. The term "perhalocarbyl" as used herein means a hydrocarbyl group where all such hydrogens have been replaced by a halogen. In addition, the term "heterohydrocarbyl" as used herein means a hydrocarbyl group where at least one carbon atom has been replaced with a hetero atom such as oxygen, nitrogen and/or sulfur.

As used herein, the term "alkyl" means a linear or branched acyclic or cyclic, saturated hydrocarbon group having a carbon chain length of from $C_1$ to $C_{25}$. Nonlimiting examples of suitable alkyl groups include methyl, ethyl, propyl, isopropyl, butyl, isobutyl, sec-butyl, tert-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl, isocanyl, cyclopropyl, cyclobutyl, cyclopentyl, cyclohexyl, cycloheptyl and cyclooctyl. As used herein, the term "heterocycloalkyl" means a cycloalkyl group in which one or more carbons of the cyclic ring has been replaced with a hetero atom, such as oxygen, nitrogen and/or sulfur. Representative heterocycloalkyl groups include but are not limited to tetrahydrofuranyl, tetrahydropyranyl, morpholinyl, and piperidinyl.

As used herein, the term "aryl" means aromatic groups that include, without limitation, phenyl, biphenyl, benzyl, xylyl, naphthalenyl, anthracenyl. As used herein, the term "heteroaryl" means an aryl group in which one or more carbons of the aromatic ring or rings has been replaced with a hetero atom, such as oxygen, nitrogen and/or sulfur. Representative heteroaryl groups include but are not limited to furanyl, pyranyl and pyridinyl.

The terms "alkaryl" and "aralkyl" are used herein interchangeably and mean a linear or branched acyclic alkyl group substituted with at least one aryl group, for example, phenyl, and having an alkyl carbon chain length of $C_1$ to $C_{25}$. It will further be understood that the above acyclic alkyl group can be a haloalkyl or perhaloalkyl group.

As used herein, the term "alkenyl" means a linear or branched acyclic or cyclic hydrocarbon group having one or more double bonds and having an alkenyl carbon chain length of $C_2$ to $C_{25}$. Non-limiting examples of alkenyl groups include, among others, vinyl, allyl, propenyl, butenyl, pentenyl, hexenyl, heptenyl, octenyl, nonenyl, decenyl, undecenyl, dodecenyl, tridecenyl, tetradecenyl, pentadecenyl, hexadecenyl, heptadecenyl, octadecenyl, nonadecenyl, and isocenyl.

As used herein, the term "alkynyl" means a linear or branched acyclic or cyclic hydrocarbon group having one or more carbon-carbon triple bonds and having an alkynyl carbon chain length of $C_2$ to $C_{25}$. Representative alkynyl groups, include but are not limited to, ethynyl, 1-propynyl, 2-propynyl, 1-butynyl, 2-butynyl, pentynyl, heptynyl, octynyl, nonynyl, decynyl, undecynyl, dodecynyl, tridecynyl, tetradecynyl, pentadecynyl, hexadecynyl, heptadecynyl, octadecynyl, nonadecynyl, isocynyl.

As used herein, recitations of "linear or branched" groups, such as linear or branched alkyl, will be understood to include a methylene group, groups that are linear, such as linear $C_2$-$C_{25}$ alkyl groups, and groups that are appropriately branched, such as branched $C_3$-$C_{25}$ alkyl groups.

For Formulae A, B and C, each X group is depicted as extending upward out of the page. With Formula A, $R^5$ and $R^6$ are each depicted as extending upward out of the page, and as such are cis- to one another and are exo- relative to the X group. Formula A, therefore is referred to as a polycyclic cis-exo 2,3-diol monomer. With Formula B, $R^5$ and $R^6$ are each depicted as extending downward into the page, and as such are cis- to one another and are endo- relative to the X group. Formula B, therefore, is referred to as a polycyclic cis-endo 2,3-diol monomer. With Formula C, $R^5$ is depicted as extending upward out of the page, exo- relative to the X group, $R^6$ is depicted as extending downward into the page, endo- relative to the X group, and trans- relative to one another. Formula C, therefore, is referred to as a polycyclic endo/exo 2,3-diol monomer or a polycyclic trans 2,3-diol monomer.

For further embodiments of the present invention, for each of Formulae A, B and C: n is 0; three of $R^1$-$R^4$, are each hydrogen; and one of $R^1$-$R^4$ is independently selected from alkyl, cycloalkyl, heteroalkyl, heterocycloalkyl, aryl, heteroaryl and aralkyl, and is oriented exo relative to X. For purposes of illustration, with n=0, X being —$CH_2$—, $R^1$, $R^2$ and $R^3$ each being hydrogen, $R^4$ being a non-hydrogen exo group relative to X, and $R^5$ and $R^6$ each being —$CH_2OH$, Formulae A, B and C can be represented by the following Formulae A1, B1 and C1.

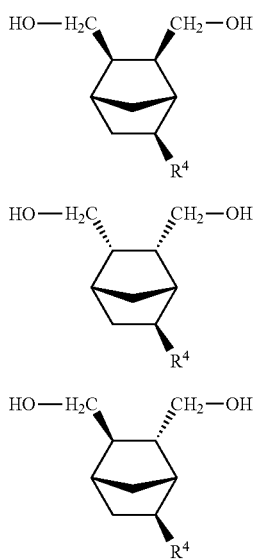

For each of Formulae A1, B1 and C1, $R^4$ can in each case be independently selected from a hydrocarbyl group including, but not limited to those classes and examples as described previously herein, for example, with regard to $R^1$-$R^4$.

Other useful diol monomers, include polycyclic diol monomers represented by the following Formulae D, E and F.

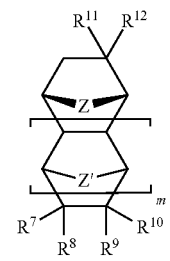

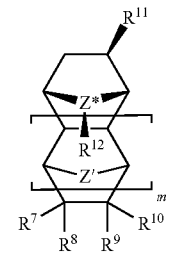

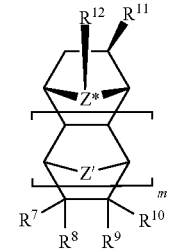

Independently for each further polycyclic diol monomer represented by Formulae D, E and F: m is 0, 1 or 2; Z and Z' are each independently selected from —$CH_2$—, —$CH_2$—$CH_2$— and —O—; Z* is —CH—; $R^7$, $R^8$, $R^9$ and $R^{10}$ are in each case independently selected from hydrogen, and a hydrocarbyl group; $R^{11}$ and $R^{12}$ are in each case independently selected from —$(CH_2)_p$—OH, where p for $R^{11}$ and $R^{12}$ is in each case independently selected from 0, 1, 2 or 3; and each Z' is, if present, oriented the same or opposite the orientation of Z or Z*, respectively.

With Formulae D, E and F, each Z group and Z* group is depicted as extending upward out of the page. With Formula D, each Z', if present, has an orientation, independently for each m, that is the same or opposite relative to the orientation of Z. With Formulae E and F, each Z', if present, has an orientation, independently for each m, that is the same or opposite relative to the orientation of Z*.

The hydrocarbyl groups from which $R^7$-$R^{10}$ can each be independently selected include, but are not limited to, those classes and examples recited previously herein. For each of Formulae D-F, in embodiments of the present invention, at least one of $R^7$-$R^{10}$ is a group independently selected from alkyl, cycloalkyl, heteroalkyl, heterocycloalkyl, aryl, heteroaryl and aralkyl, and the other $R^7$-$R^{10}$ group(s), if any, that are not selected from such non-hydrogen groups, are each hydrogen. Examples of alkyl, cycloalkyl, heteroalkyl, heterocycloalkyl, aryl, heteroaryl and aralkyl groups from which each of $R^7$-$R^{10}$ can be selected include, but are not limited to, those classes and examples as recited previously herein with regard to $R^1$-$R^4$.

In further embodiments, for each of Formulae D-F: m is 0; three of $R^7$-$R^{10}$ are each hydrogen; and one of $R^7$-$R^{10}$ is independently selected from alkyl, cycloalkyl, heteroalkyl, heterocycloalkyl, aryl, heteroaryl and aralkyl, and is oriented exo relative to Z or Z*. For purposes of illustration, with m=0, Z being —CH$_2$—, R$^7$, R$^8$ and R$^9$ each being hydrogen, R$^{10}$ being a non-hydrogen exo group, R$^{11}$ and R$^{12}$ each being —CH$_2$OH for Formula D and —OH for Formulae E and F, Formulae D-F can be represented by the following Formulae D1, E1 and F1. For purposes of further illustration, with m=0, Z being —CH$_2$—, R$^8$, R$^9$ and R$^{10}$ each being hydrogen, R$^7$ being a non-hydrogen exo group, R$^{11}$ and R$^{12}$ each being —CH$_2$OH for Formula D and —OH for Formulae E and F, Formulae D-F can be represented by the following Formulae D1', E1' and F1'. It will be understood, that unless specifically stated, all Formulae presented herein are inclusive of the enantiomeric, and diasteriomeric analogs thereof.

Still other diol monomers, include polycyclic diol monomers represented by the following Formula G.

G

With the polycyclic diol represented by Formula G, Z, R$^{11}$ and R$^{12}$ are each as described previously herein with regard to Formulae E-F.

Additional diol monomers, include cyclic diol monomers represented by the following Formulae I through XII.

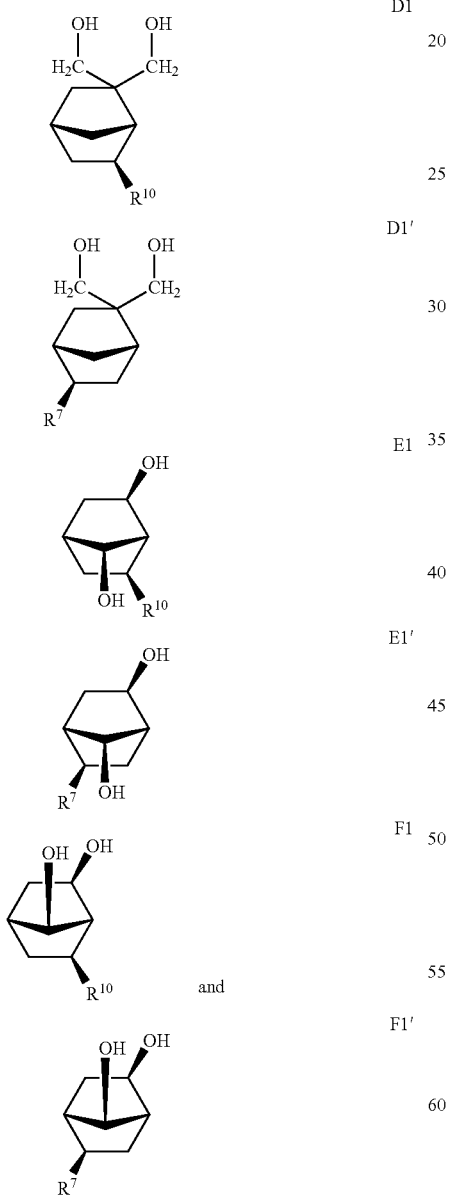

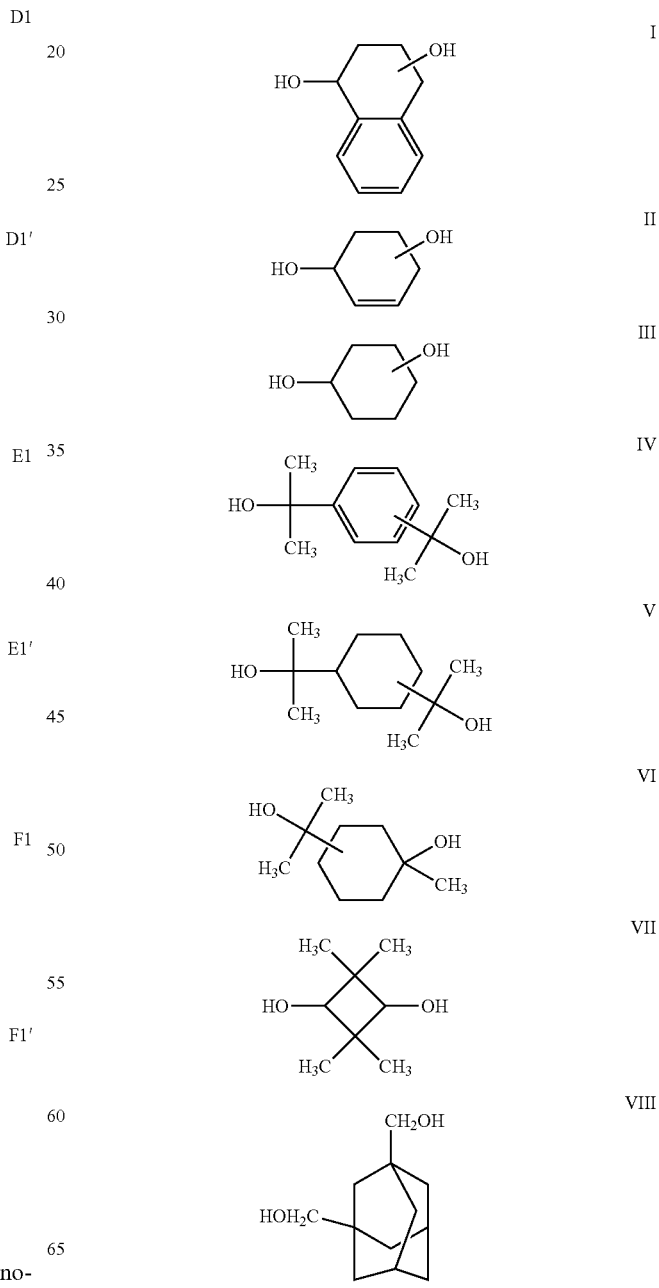

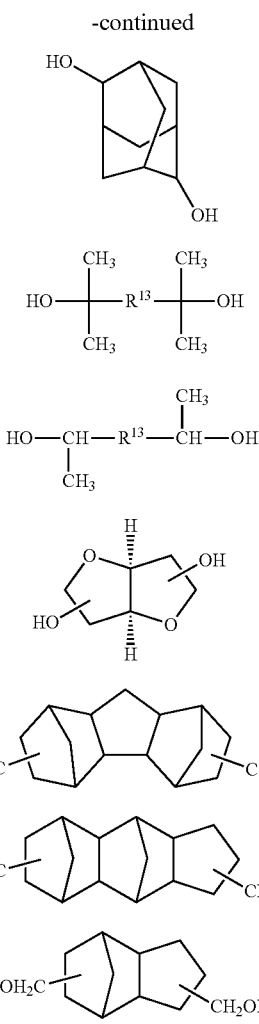

With Formulae X and XI, $R^{13}$ is independently selected from $C_1$-$C_6$ alkyl, such as but not limited to $C_1$-$C_6$ linear alkyl or $C_3$-$C_6$ branched alkyl.

Further optional polyol monomers include, but are not limited to, hydrocarbyls having two or more hydroxyl groups, such as but not limited to 2, 3 or 4 hydroxyl groups. Examples of optional diol monomers include, but are not limited to: $C_1$-$C_{25}$ linear or branched alkylene diols, such as, 1,2-ethylenediol, 1,3-propylenediol and 1,2-propylenediol; and polyalkyleneglycols, such as di-, tri-, tetra- and higher ethyleneglycols, di-, tri, tetra- and higher propyleneglycols. Optional polyol monomers having more than two hydroxyl groups are typically present in small amounts, such as but not limited to less than 10 mole percent, or less than 5 mole percent, based on the total mole percent of hydroxyl functional monomers. Examples of polyol monomers having more than two hydroxyl groups include, but are not limited to, trimethylolpropane, pentaerythritol and di-trimethylolpropane. For some embodiments, the polycarbonate polymer is not derived from polyol monomers having more than two hydroxyl groups.

The polycyclic 2,3-diol monomers represented by Formulae A, B and C can be prepared by art-recognized methods such as are shown in Synthetic Schemes 1 through 6, shown hereinbelow.

For purposes of non-limiting illustration, the polycyclic cis-exo 2,3-diol monomer represented by Formula A can be prepared in accordance with the following Synthetic Scheme 1, in which n is 0, $R^1$-$R^4$ are each hydrogen, X is —$CH_2$—, and $R^5$ and $R^6$ are each —$CH_2OH$.

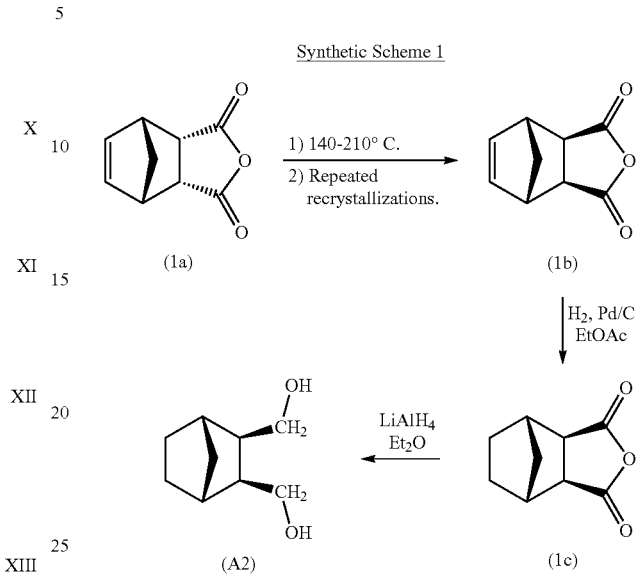

With reference to Synthetic Scheme 1, endo-2,3-norbornene dicarboxylic acid anhydride (also referred to as endo-nadic anhydride) (1a) is exposed to a temperature of 140 to 210° C. for a sufficient period of time, such as from 15 minutes after melting to 24 hours, followed by repeated recrystallizations, such as 2 or more recrystallizations from ethyl acetate or toluene, so as to form exo-2,3-norbornene dicarboxylic acid anhydride (also referred to as exo-nadic anhydride) (1b). Hydrogenation of cis-exo-nadic anhydride (1b) in the presence of hydrogen gas ($H_2$), palladium catalyst supported on porous carbon (Pd/C), and ethyl acetate (EtOAc), results in formation of exo-2,3-norbornane dicarboxylic acid anhydride (1c). Reduction of exo-2,3-norbornane dicarboxylic acid anhydride (1c) in the presence of lithium aluminum hydride (LiAlH$_4$) and ethyl ether (Et$_2$O) results in formation of cis-exo-2,3-norbornanedimethanol (A2).

For purposes of further non-limiting illustration, the polycyclic cis-endo 2,3-diol monomer represented by Formula B can be prepared in accordance with the following Synthetic Scheme 2, in which n is 1, $R^1$-$R^4$ are each hydrogen, X is —$CH_2$—, and $R^5$ and $R^6$ are each —$CH_2OH$.

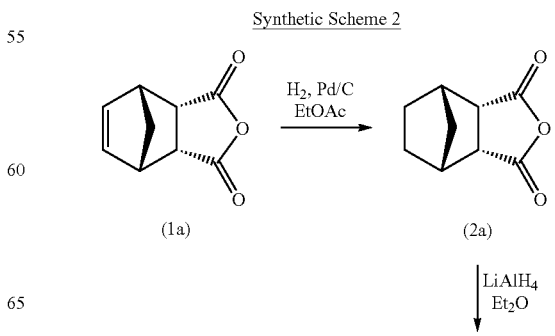

-continued

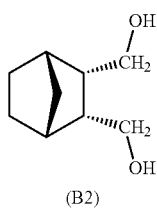

(B2)

With reference to Synthetic Scheme 2, cis-endo-2,3-norbornene dicarboxylic acid anhydride (also referred to as endo-nadic anhydride) (1a) is hydrogenated in the presence of hydrogen gas ($H_2$), palladium catalyst supported on porous carbon (Pd/C), and ethyl acetate (EtOAc), results in formation of endo-2,3-norbornane dicarboxylic acid anhydride (2a). Reduction of endo-2,3-norbornane dicarboxylic acid anhydride (2a) in the presence of lithium aluminum hydride ($LiAlH_4$) and ethyl ether ($Et_2O$) results in formation of cis-endo-2,3-norbornanedimethanol (B2).

The polycyclic endo-exo-2,3-diol monomer represented by Formula C can be prepared in accordance with the following Synthetic Scheme 3, which is provided for purposes of non-limiting illustration, in which n is 0, $R^1$-$R^4$ are each hydrogen, X is —$CH_2$—, and $R^5$ and $R^6$ are each —$CH_2OH$.

Synthetic Scheme 3

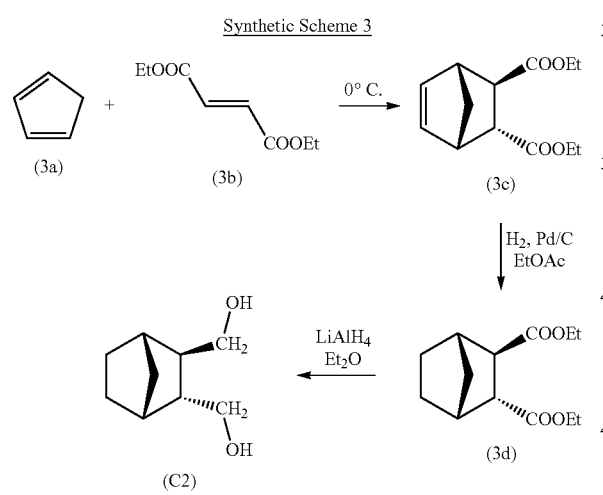

With reference to Synthetic Scheme 3, cyclopentadiene (3a) and diethyl fumarate (3b) are reacted together by means of Diels-Alder reaction at reduced temperature, such as 0° C., so as to form endo-exo-2,3-norbornene bis(ethylcarboxylate) (3c). Hydrogenation of endo-exo-2,3-norbornene bis(ethylcarboxylate) (3c) in the presence of hydrogen gas ($H_2$), palladium catalyst on porous carbon (Pd/C), and ethyl acetate (EtOAc), results in formation of endo-exo-2,3-norbornane bis(ethylcarboxylate) (3d). Reduction of endo-exo-2,3-norbornane bis(ethylcarboxylate) (3d) in the presence of lithium aluminum hydride ($LiAlH_4$) and ethyl ether ($Et_2O$) results in formation of exo-endo-2,3-norbornanedimethanol (C2).

The polycyclic cis-exo-2,3-diol monomer represented by Formula A can be prepared in accordance with the following Synthetic Scheme 4, which is provided for purposes of non-limiting illustration, in which n is 0, $R^1$-$R^4$ are each hydrogen, X is —$CH_2$—, $R^5$ is —OH and $R^6$ is —$CH_2OH$.

Synthetic Scheme 4

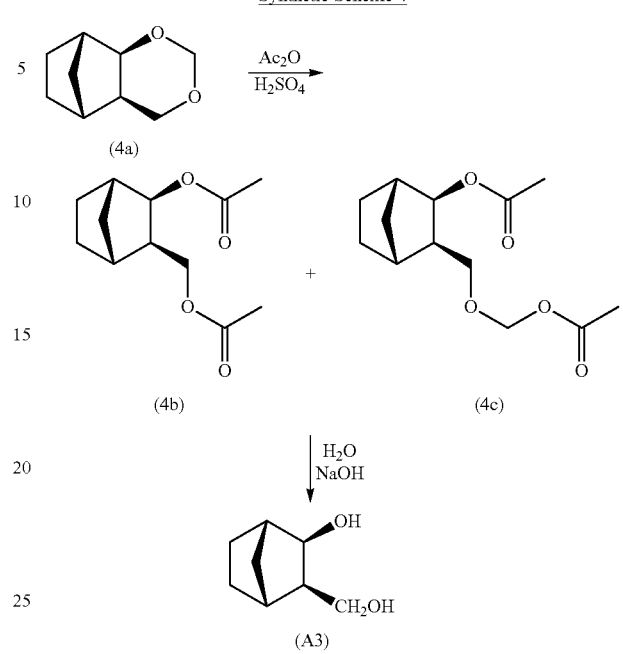

With reference to Synthetic Scheme 4, hexahydro-4H-5,8-methanobenzo[d]-exo-[1,3]dioxane (4a) is converted to cis-exo-(3-acetoxynorborn-2-yl)methyl acetate (4b) and cis-exo-((3-acetoxynorborn-2-yl)methoxy)methyl acetate (4c) in the presence of acetic anhydride ($Ac_2O$) and a catalytic amount of sulfuric acid ($H_2SO_4$). The intermediates (4b) and (4c) are converted to cis-exo-3-(hydroxymethyl)norbornan-2-yl (A3) in the presence of water and a catalytic amount of sodium hydroxide (NaOH).

The polycyclic cis-endo-2,3-diol monomer represented by Formula B can be prepared in accordance with the following Synthetic Scheme 5, which is provided for purposes of non-limiting illustration, in which n is 0, $R^1$-$R^4$ are each hydrogen, X is —$CH_2$—, $R^5$ is —OH and $R^6$ is —$CH_2OH$.

Synthetic Scheme 5

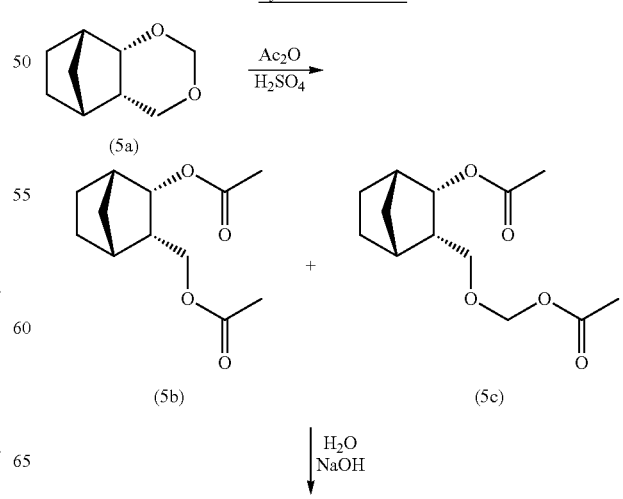

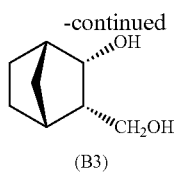

(B3)

With reference to Synthetic Scheme 5, hexahydro-4H-5,8-methanobenzo[d]-endo-[1,3]dioxane (5a) is converted to cis-endo-(3-acetoxynorborn-2yl)methyl acetate (5b) and cis-endo-((3-acetoxynorborn-2-yl)methoxy)methyl acetate (5c) in the presence of acetic anhydride ($Ac_2O$) and a catalytic amount of sulfuric acid ($H_2SO_4$). The intermediates (5b) and (5c) are converted to cis-endo-3-(hydroxymethyl) norbornan-2-yl (B3) in the presence of water and a catalytic amount of sodium hydroxide (NaOH).

The optional polycyclic diols represented by Formulae D, E, F and G can be prepared by art-recognized methods. For purposes of non-limiting illustration, the optional polycyclic diol represented by Formula F can be synthesized in accordance with the following Synthetic Scheme 6, where m is 0, $R^7$-$R^{10}$ are each hydrogen, Z is —$CH_2$—, $R^{11}$ is —OH and $R^{12}$ is —$CH_2OH$.

Synthetic Scheme 6

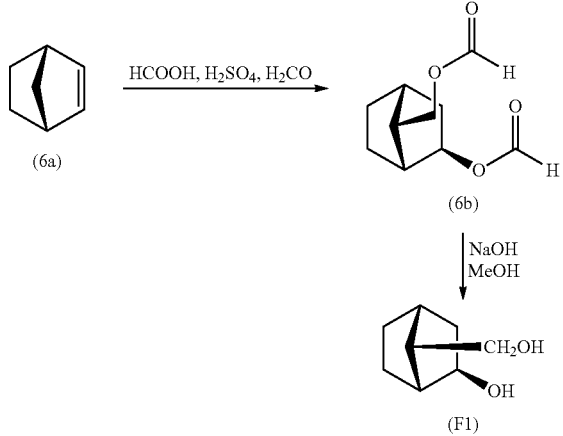

With reference to Synthetic Scheme 6, 2,3-norbornene (6a) is converted to (2-(formyloxy)norborn-7-yl)-exo-methyl formate (6b) in the presence of formic acid (HCOOH) sulfuric acid ($H_2SO_4$) and formaldehyde ($H_2CO$). Intermediate (6b) is then converted to 7-(hydroxymethyl) norbornan-2-exo-ol (F1) in the presence of sodium hydroxide (NaOH) and methanol (MeOH).

The polycarbonate polymer embodiments according to the present invention can be prepared by art-recognized methods that include, but are not limited to the methods of Polymerization Examples 1-12 and can be selected from homopolymers, such as homopolymers containing a single type of repeating unit derived from any one of Formulae A through G and/or I through XV or random copolymers, or block copolymers, or alternating copolymers, which are alternatively referred to herein as random polymers, block polymers and alternating polymers. The random, block and alternating polycarbonate copolymer embodiments according to the present invention can include two or more types of repeating units derived from at least one of Formulae A through G and optionally at least one of Formulae I through XV.

Some of the polycarbonate polymer embodiments as described above can encompass repeating units derived from polycyclic 2,3-diols selected from each of Formulae A through G or selected from any one or two of such formulae.

When such a polycarbonate polymer embodiments encompass repeating units derived from two polycyclic 2,3-diol monomers represented by and selected from, for example, Formula A, Formula B and Formula C, the mole percent ratio of such repeating units can be from 1 to 99, from 10 to 90, from 30 to 70, or any other subratio subsumed in any of such recited ratios, provided that the sum of mole percents of such repeating units is 100 mole percent.

Some of the polycarbonate polymer embodiments of the present invention encompass monomers represented by and selected from each of, for example, Formula A, Formula B and Formula C. Such embodiments will be understood to include mole percent ratios where any single mole percent is 1, any single mole percent is 98 as well as any other subratio subsumed therein. Without limitation, such mole percent ratios include, 1 to 1 to 98, 10 to 10 to 80, and 33.33 to 33.33 to 33.33, provided that the sum of mole percents of such repeating units is 100 mole percent.

For some polycarbonate polymer embodiments in accordance with the present invention, $R^5$ and $R^6$ of each of Formulae A through G, can be independently selected from —$(CH_2)_p$—OH, where p is 0, 1, 2 or 3. While for other such embodiments, for at least one of $R^5$ and $R^6$, p is independently 1, 2 or 3, for example providing —$CH_2OH$ where p is 1. In still other such embodiments, for each of $R^5$ and $R^6$, p is independently 1, 2 or 3.

In the Examples provided hereinbelow general procedures for the formulating polymer composition embodiments in accordance with the present inventions are provided. Such polymer composition embodiments, alternately referred to herein as TFU polymer compositions, encompass a polymer embodiment, a carrier solvent, and a fluxing agent, for example, formic acid (FA). While it should be understood that each of the TFU polymer compositions mentioned were actually made and results of the several evaluations made reported, the inventors believe that providing such general procedures is sufficient to demonstrate that embodiments in accordance with the present invention have been actually reduced to practice and will be useful for providing both holding of microelectronic components during and post their assembly onto substrates as well as sufficient fluxing activity to provide excellent solder bonds.

As used herein, a "fluxing agent" will be understood to mean a chemical cleaning agent that facilitates soldering by removing oxidation from the metals to be joined. Fluxing agents may include, but are not limited to acidic, neutral, or basic compositions. Exemplary embodiments of fluxing agents include, but are not limited to, formaldehyde, formic acid, 2-nitrobenzoic acid, malonic acid, citric acid, malic acid and succinic acid. Other exemplary fluxing agents include oxalic acid, adipic acid, glutaric acid, pimelic acid, suberic acid, azelaic acid, sebacic acid, maleic acid, tartaric acid, lactic acid, mandelaic acid, glyceric acid, valeric acid, caproic acid, phenylacetic acid, benzoic acid, salicylic acid and aminobenzoic acid. For ease of comparison and understanding, formic acid (FA) was used as the fluxing agent in the examples that follow, such examples demonstrating that FA provides excellent fluxing by and through the solder reflow data presented. Additionally, storage stability data is provided to demonstrate that storage of polymer formulation embodiments of the present invention at elevated temperatures does not indicate any apparent $M_w$ change in the polymer of such embodiments in the presence of FA or other commonly employed fluxing agents (See, Tables 5 and 6, below).

As used herein, a "carrier solvent" will be understood to mean a solvent used to form a solution of a selected polymer embodiment in accordance with the present invention and a selected fluxing agent thus forming a polymer composition embodiment in accordance with the present invention. It will further be understood that such a carrier solvent will be essentially unreactive with the selected polymer embodiment as well as the selected fluxing agent. That is to say that such polymer composition embodiment will exhibit desirable storage stability as well as providing desirable tackiness, fluxing and underfill. Exemplary carrier solvents include, but are not limited to, cyclohexanone, cyclopentanone, diethylene glycol dimethyl ether, gamma-butyrolactone (GBL), N,N-dimethylacetamide, N,N-dimethylformamide, anisole, acetone, methyl 3-methoxypropionate, tetrahydrofuran (THF) and mixtures thereof.

Further, while the solder reflow data presented hereinbelow was obtained using tin-copper eutectic solder balls (Sn99.3Cu0.7), other types of solders, and in particular lead free solders, such as SAC305 (Sn96.5Ag5Cu0.5 from M.G. Chemical) or K100 and K100LD (Sn99.4Cu0.6 and Sn99.5Cu0.5, respectively, Kester, Inc.), can also be used effectively with or without adjusting any particular formulation. Still further, it will be understood that the inventors demonstrate through the examples provided hereinbelow that there is no single effective TFU polymer composition, but rather many formulations of a polymer embodiment, a carrier solvent, and a fluxing agent that can be made available for a wide range of microelectronic component assembly. That is to say, polymer composition embodiments in accordance with the present invention can be readily tailored with regard to decomposition temperature, tackiness, $M_w$ and fluxing activity to provide excellent solutions for a wide range of assembly processing.

In summary, polymer composition embodiments of the present invention having formic acid (FA) as the fluxing agent were prepared and evaluated to demonstrate the extent of their fluxing activity. Referring to Table 3, it can be observed that Examples C1-C3, demonstrate solder spread or reflow, i.e., the diameter of the spread solder was about 1.6 times the diameter of the original solder ball as represented in the control sample, C4. While FA was the only fluxing agent used for the aforementioned reflow examples, it will be understood that other known fluxing agents, such as are mentioned above, are also within the scope of the TFU polymer composition embodiments of the present invention. Further, while Solder Flux Examples C1-C3 employ syringe application of the formulations of Examples B1-B3, any other appropriate method for applying the formulations can be used. Thus, in addition to syringe application, exemplary application methods include, among others, spin coating, spraying, dip-coating and doctor blading.

In the Examples and Tables presented below, several trade names and or abbreviations are used to identify components of the polymer composition embodiments of the present invention. While in most cases such examples also provide the full name of such components, chemical names for some components may not be completely identified in the Examples.

EXAMPLES

A. Polymer Synthesis

Polymerization Example 1

Cis-exo-2,3-Norbornanedimethanol and cis-endo-2,3-Norbornanedimethanol

To an appropriately sized and equipped multi-necked reaction vessel, were added 22.5 grams of cis-exo-2,3-norbornanedimethanol (144 mmol), 15.0 grams of cis-endo-2,3-norbornanedimethanol (96 mmol), 51.3 grams of diphenyl carbonate (240 mmol), and 12 milligrams of lithium hydride (1.5 mmol). The contents of the vessel were heated to and held at 120° C. under a nitrogen sweep for a period of time sufficient to form a reaction solution and then held at that temperature for 2 hours, under nitrogen, with constant stirring. The pressure of the reaction vessel was then reduced, isothermally, to 10 kPa and stirring continued for an additional hour. Then the pressure of the vessel was further reduced, isothermally, to 0.5 kPa, and stirred for an additional 1.5 hours, followed by increasing the temperature of the reaction solution to 180° C. and maintaining that temperature, with stirring for another 1.5 hours. The contents of the reaction vessel were then cooled to room temperature, tetrahydrofuran (800 mL) added with stirring and the resulting solution filtered. The filtrate was then added dropwise to 8 liters of a 9:1 methanol:water solution causing precipitation of the desired polymer. After isolating the precipitate and washing it with an additional 4 liters of a 9:1 methanol:water solution, the polymer was dried to constant weight. 30.7 grams of polymer were obtained. The polymer yield was 70%, its molecular weight ($M_w$), was 41,000 and polydispersity index (PDI) was 1.70.

Polymerization Example 2: 1,3-Cyclohexanediol and cis-exo-2,3-Norbornanedimethanol The procedure used in Example 1 was followed except that the reaction vessel was charged with 20.5 grams of 1,3-cyclohexanediol (176 mmoles (TCI America, Portland, Oreg.)); 15.5 grams of cis-exo-2,3-norbornanedimethanol (99 mmoles); 56.6 grams of diphenyl carbonate (264 mmoles); and 13.2 mg of lithium hydride (1.7 mmoles). 28.1 grams of polymer was obtained in a yield of 69%. The polymer was found to have a $M_w$ of 47,000, and a PDI of 1.75.

Polymerization Example 3: 1,3-Cyclohexanediol and cis-endo-2,3-Norbornanedimethanol The procedure used in Example 1 was followed except that the reaction vessel was charged with 19.2 grams of 1,3-cyclohexanediol (165 mmoles, TCI America); 14.5 grams of cis-endo-2,3-norbornanedimethanol (93 mmol); 53 grams of diphenyl carbonate (248 mmol); and 10.1 mg of lithium hydride (1.3 mmol). 28.7 grams of polymer were obtained in a yield of 76 percent. The polymer $M_w$ was 38 k, with a PDI of 1.61.

The properties of the polycarbonates obtained from Polymerization Examples 1-3 are summarized below in Tables 1 and 2. In Table 2, the column "End Ph" is the chain-end phenyl group percent mole values indicating the theoretical amount of phenol, based on the initial amount of diphenyl carbonate raw material charged and not removed during polymerization; the column "Mole %" provides values determined by $^1$H NMR analysis, and indicate the percent of monomer units in the polymers derived from cis-exo- or cis-endo-2,3-norbornanedimethanol monomer, as indicated; and the column "Solubility" is a qualitative representation as to whether a target resin content (RC, 20 wt %) of the polymer was soluble or insoluble in the indicated solvent, where "A" refers to anisole and "G" refers to gamma-butyrolactone.

TABLE 1

| Ex. # | % Yld | $M_w$ | PDI | $T_g$ °C. | $T_{d5}$ °C. | $T_{d50}$ °C. | $T_{d95}$ °C. |
|---|---|---|---|---|---|---|---|
| PE1 | 70 | 41,000 | 1.70 | 89 | 279 | 291 | 298 |
| PE2 | 68 | 47,000 | 1.75 | 112 | 262 | 285 | 309 |
| PE3 | 74 | 38,000 | 1.61 | 117 | 269 | 293 | 315 |

TABLE 2

| Example # | End Ph (a) (%) | Mole % (b) (Empirical) | Solubility (c) RC = 20% |
|---|---|---|---|
| PE1 | 10 | exo = 59 | A: soluble G: insoluble |
| PE2 | 18 | exo = 41 | A: soluble G: soluble |
| PE3 | 17 | endo = 41 | A: soluble G: soluble |

Polymerization Example 4:
cis-exo-2,3-Norbornanedimethanol homopolymer

The procedure used in Example 1 was followed except that the reaction vessel was charged with 25.0 g (160 mmol) of cis-exo-2,3-norbornane dimethanol and 34.3 g (185 mmol) of diphenyl carbonate and 6.4 mg (0.80 mmol) of lithium hydride. After initial polymer precipitation, the material was redissolved in tetrahydrofuran and precipitated once more into pure methanol. After filtration and drying in a dynamic vacuum oven, 23.5 g white polymer was obtained. Polymer properties are summarized as follow: $M_w$=72 k, PDI=3.0, $T_g$=85° C., $T_{d50}$=313° C.

Polymerization Example 5:
5-exo-Phenyl-cis-endo-2,3-Norbornanedimethanol Homopolymer The procedure used in Example 1 was followed except that the reaction vessel was charged with 25.0 g (108 mmol) of 5-exo-phenyl-cis-endo-2,3-norbornanedimethanol and 23.1 g (108 mmol) of diphenyl carbonate and 58.0 mg (0.55 mmol) of sodium carbonate. Polymer solution in tetrahydrofuran was dropwise added to pure methanol during precipitation. After filtration and drying in a dynamic vacuum oven, 19.6 g white polymer was obtained. Polymer properties are summarized as follow: $M_w$=63 k, PDI=2.0, $T_g$=114° C., $T_{d50}$=321° C.

Polymerization Example 6:
5-exo-Phenyl-cis-exo-2,3-Norbornanedimethanol Homopolymer The procedure used in Example 1 was followed except that the reaction vessel was charged with 10.0 g (43 mmol) of 5-exo-phenyl-cis-exo-2,3-norbornanedimethanol and 9.2 g (43 mmol) of diphenyl carbonate and 1.7 mg (0.22 mmol) of lithium hydride. Polymer solution in a mixture of methylene chloride and tetrahydrofuran was dropwise added to pure methanol during precipitation. After filtration and drying in a dynamic vacuum oven, 9.1 g white polymer was obtained. Polymer properties are summarized as follow: $M_w$=49 k, PDI=2.0, $T_g$=115° C., $T_{d50}$=284° C.

Polymerization Example 7:
trans-2,3-Norbornanedimethanol homopolymer

The procedure used in Example 1 was followed except that the reaction vessel was charged with 70.0 g (448 mmol) of trans-2,3-norbornane dimethanol and 96.5 g (450 mmol) of diphenyl carbonate and 238 mg (2.24 mmol) of sodium carbonate. Polymer solution in tetrahydrofuran was dropwise added to pure methanol during precipitation. After filtration and drying in a dynamic vacuum oven, 75.4 g white polymer was obtained. Polymer properties are summarized as follow: $M_w$=177 k, PDI=2.1, $T_g$=81° C., $T_{d50}$=360° C.

Polymerization Example 8: Isosorbide Homopolymer

The procedure used in Example 1 was followed except that the reaction vessel was charged with 102.3 g of isosorbide (0.7 mol, Cargill Inc., Minneapolis, Minn.); 149.95 g of diphenyl carbonate (0.7 mol); and 3.0 mg of cesium carbonate (0.01 mmol). The crude polymer was dissolved in gamma-butyrolactone (GBL). About 119 g of the poly (isosorbide) homopolymer was obtained after precipitation into 7:3 isopropanol:water, filtration, and vacuum drying. Polymer properties are summarized as follow: $M_w$=38.5 k, PDI=2.61, $T_g$=167° C., $T_{d50}$=376° C.

Polymerization Example 9: Isosorbide and trans-2,3-Norbornanedimethanol

The following were added to a 250 mL round flask charged with a suitably sized magnetic stirrer: 13.17 g of isosorbide (90 mmol, Cargill Inc.), 14.09 g of trans-2,3-norbornanedimethanol (90 mmol), 38.63 g of diphenyl carbonate (180 mmol), and 95.6 mg of sodium carbonate (9.0 mmol). The flask was evacuated to 1.3 kPa and refilled with nitrogen three times. The contents were kept under nitrogen when the flask was immersed into an oil bath at 120° C. The reaction was kept at 120° C. for 2 hours under a nitrogen sweep. The contents of the flask were then subjected to a reduced pressure of 10 kPa at 120° C. for 1 hour. Subsequently, the oil bath temperature was gradually increased from 120 to 180° C. at 10 kPa, during which a majority of phenol is distilled over and collected in a liquid nitrogen cooled trap. The pressure was gradually reduced to 0.7 kPa and the reaction was held at 180° C. for an additional 2 hours. The contents of the flask were cooled to room temperature and dissolved in a suitable amount of tetrahydrofuran, such as 150 mL, with orbit shaking. The solution was further diluted to 500 mL with tetrahydrofuran and filtered. The filtered solution was dropwise added to 5 liters of methanol. The white polymer was collected by filtration and dried in a vacuum oven (70° C., 29.4 inches water vacuum) for 18 hours. Dry polymer weight was 30.2 g. Polymer properties are summarized as follow: $M_w$=32 k, PDI=1.94, $T_g$=116° C., $T_{d50}$=372° C.

Polymerization Example 10: Isosorbide and 1,4-Cyclohexanedimethanol

The procedure used in Example 10 was followed except that the reaction vessel was charged with 29.04 g of isosorbide (199 mmol, Cargill Inc.), 28.7 g of 1,4-cyclohexanedimethanol (199 mmol), 85.2 g of diphenyl carbonate (398 mmol), and 211 mg of sodium carbonate (19.9 mmol). Dry polymer weight was 65.1 g. Polymer properties are summarized as follow: $M_w$=72 k, PDI=2.84, $T_g$=110° C., $T_{d50}$=373° C.

Polymerization Example 11: Cyclic Norbornane Spirocarbonate Homopolymer sec-Butyllithium (0.21 mL, 1.4 M in cyclohexanone) was added to spiro[bi-cyclo[2.2.1]heptane-2,5'-[1,3]dioxan]-2'-one (15 g, 82.3 mmol) in toluene (200 mL) at 0° C. under a nitrogen blanket. The reaction mixture was stirred at 0° C. for 5 hours and then gradually allowed to warm to room temperature. Stirring was continued for an additional 12 hours at room temperature after which the polymer was precipitated from methanol, and dried under vacuum to give 9 g of a white polymer. Polymer $M_w$ was determined to be 32 k with a PDI of 1.63 and a $T_{d50}$=284° C.

B. Fluxing Formulation Examples

Example B1: Formulation of Polycarbonate from 1,3-Cyclohexanediol and endo-endo-2,3-Norbornanedimethanol with Formic Acid in GBL Dry polymer (4.54 g) prepared following procedures in Polymer Example 3 was added to gamma-butyrolactone (GBL) to give a polymer solution with a total weight of 12.8 g (35.3 wt % resin content). A clear, viscous, homogeneous polymer solution was obtained by roller mixing for a minimum of 12 hours. The viscous solution was filtered by passing through 1.0 µm disc filters made of PTFE, and the viscosity was determined to be 17500 cPs at 25° C. with a Brookfield viscometer (Model DV I Prime). Formic acid (0.67 g, 5 wt % of total solution) is then added and a homogeneous formulation is obtained after roller mixing for 8 hours.

Example B2: Formulation of Polycarbonate from Isosorbide and endo-exo-2,3-Norbornanedimethanol with Formic Acid in GBL A polycarbonate formulation according to embodiments of the present invention was prepared in accordance with the procedure described in Example B1 with 5.25 g dry polymer from Polymer Example 9 to give a base polymer solution of 15.0 g (35.0 wt % resin content). The viscosity was determined to be 4600 cPs. Formic acid added is 0.78 g.

Example B3: Formulation of Polycarbonate from Isosorbide and 1,4-Cyclohexanedimethanol with Formic Acid in GBL A polycarbonate formulation according to embodiments of the present invention was prepared in accordance with the procedure described in Example B1 with 2.00 g dry polymer from Polymer Example 10 to give a base polymer solution of 10.0 g (20.0 wt % resin content). The viscosity was determined to be 8000 cPs. Formic acid added is 0.52 g.

C. Solder Flux Evaluation with Formic Acid in GBL

The formulations of Examples B1-B3 were used to provide the data for Evaluations C1-C3, respectively, as shown in Table 3. The process used for these examples was as follows: the formulation was dispensed as distinct spots with a 27-gauge needle onto a copper plate (1.7 cm×3.4 cm) with a partly oxidized surface. A solder ball (Sn99.3Cu0.7; 600 µm) was carefully transferred to the top of each of the spots on the copper plate. The entire plate, mounted onto a device, was subjected to thermal reflow by increasing the ambient temperature surrounding the plate from room temperature to between 230 and 260° C. in less than 2 minutes as the plate was passing through a reflow oven. The final temperature was then maintained for an additional 2 minutes before allowing the plate to return to room temperature. It was observed during the transfer of the plate carrying the carefully placed solder balls, that each spot of polymer composition held the solder ball placed thereon in position, thus demonstrating that such composition was a useful tacking agent. The diameter of the solder material as measured after reflow, ranged from 930 to 990 µm which when compared to the control (C4) demonstrated excellent fluxing. The formulation for the control (C4) was formulation B2 without formic acid. The results of the solder reflow of Examples C1-C4 are shown in Table 3, below.

TABLE 3

| Example | Formulation from Example | Loading of Formic Acid (wt %) | Solder diameter after reflow (µm) |
|---|---|---|---|
| C1 | B1 | 5 | 930 |
| C2 | B2 | 5 | 990 |
| C3 | B3 | 5 | 940 |
| C4 | Control | 0 | 600 |

D. Thermal Stability Examples

D1: Isothermal Thermogravimetric Analysis of Polycarbonate from Isosorbide and endo-exo-2,3-Norbornanedimethanol A polymer composition was formulated from a polymer made in the manner of Polymer Example 9 ($M_w$=32 k) and an appropriate amount of gamma-butyrolactone. The composition was spin-coated onto a four-inch silicon substrate and baked at 120° C. for 10 minutes to yield a clear film. A sample of the film was peeled from the substrate and analyzed by isothermal thermogravimetric analysis at 220° C. The weight loss after one hour was less than 2% compared to initial film weight. The weight loss of a similar sample at 260° C. was less than 5% in one hour, suggesting that the material had thermal stability within the 200° C. to 260° C. window.

D2: Film Thickness Evaluation Upon Thermal Reflow

A polymer composition was formulated from a polymer made in the manner of Polymer Example 9 ($M_w$=32 k) and an appropriate amount of gamma-butyrolactone. The composition was spin-coated onto a four-inch silicon substrate and baked at 120° C. for 10 minutes to give an approximately 2 µm thick film. The silicon substrate was heated in a reflow oven by increasing the temperature surrounding the plate from room temperature to between 230° C. and 260° C. in less than 2 minutes. The substrate was held at that temperature for an additional 2 minutes and then allowed to cool to room temperature. The final film thickness was recorded and compared to the initial film thickness prior to heating. As shown in Table 4, the thickness variation is ≤1%, well within typical film thickness measurement error, and no deterioration of film quality was observed. All data indicate that the material is suitable for use as a permanent material between 230° C. and 260° C.

TABLE 4

Film Thickness Data

| Polycarbonate | Initial Film Thickness (μm) | Post-reflow film thickness (μm) | % Change in Thickness |
|---|---|---|---|
| PE9 | 2.07 | 2.05 | 1.0 |
| PE9 | 1.78 | 1.77 | 0.6 |

E. Storage Stability Examples of Formulations with Formic Acid

For the following examples, the formulations with formic acid (FA) in gamma-butyrolactone were prepared and stored at 65° C. for one week, after which the final molecular weight $M_w$(Final) was determined. The $M_w$ ratio in Table 5 was determined by evaluating the ratio of $M_w$(final)/$M_w$(initial), where $M_w$(initial) was taken as the molecular weight determined prior to heating to 65° C. As shown, each sample indicated stability for the time it was stored.

TABLE 5

| Formulation | $M_w$(Initial) | Loading of FA (wt %) | $M_w$ Ratio |
|---|---|---|---|
| B1 | 52k | 5.0 | 0.99 |
| B1 | 52k | 10.0 | 0.97 |
| B2 | 31k | 5.0 | 0.99 |
| B2 | 31k | 10.0 | 0.97 |

F. Storage Stability Examples of Formulations with Other Acidic Fluxing Agents For each of the previously known acidic fluxing agents listed in Table 6, below, a formulation of poly(propylene carbonate) (Novomer, Inc.) in gamma-butyrolactone was prepared using the indicated loading of Fluxing Agent. An initial $M_w$ was determined and the sample stored at 95° C. for 48 hours, after which a final $M_w$ was determined and the ratio of $M_w$(final)/$M_w$(initial) calculated. While the storage time for these formulations was shorter than for the storage stability examples of the formic acid formulations reported in Table 5, it is believed that with the higher temperature at which these formulations were stored, the conditions for these storage stability examples were at least as stringent as were the conditions for the formic acid storage stability examples. Therefore, as shown, for each of formulations shown in Table 6, indicated stability.

TABLE 6

| Fluxing agent | Loading (wt %) | Initial $M_w$ | $M_w$ Ratio |
|---|---|---|---|
| 2-Nitrobenzoic acid | 5.0 | 72K | 0.99 |
| Malonic acid | 3.0 | 72K | 0.97 |
| | 5.0 | 72K | 0.97 |
| Citric acid | 2.0 | 71K | 0.98 |
| | 5.0 | 72K | 0.94 |
| Malic acid | 5.0 | 73K | 0.95 |
| Succinic acid | 3.0 | 72K | 0.97 |
| | 5.0 | 73K | 0.95 |

By now it should be realized that TFU polymer composition embodiments in accordance with the present invention have been provided herein that demonstrate both the ability to provide fluxing for solder reflow type of attachment of microelectronic components to a substrate, and the ability to act as an underfill connection to hold such components in place prior to, during, and after the solder reflow process. Additionally it should be realized that such TFU compositions can encompass a variety of polymer embodiments where such polymer embodiments can be tailored to have a desired $T_{d50}$ by and through adjusting the $M_w$ of such polymers and/or the composition of such polymer. Further, it should be realized that any one or more of the previously mentioned fluxing agents in combination with any one or more of the aforementioned polymer embodiments and any one or more of the aforementioned carrier solvents to form a desired TFU polymer composition in accordance with the present invention. Further, it should be realized that while the formulation examples above demonstrate polymer weight percents from 20 to more than 35, some TFU polymer composition embodiments encompass ranges of polymer weight percentages from 15 to 50 and still others from 10 to 80; where such various wt % of polymer are effective to select a desired viscosity of the TFU composition as well as properties of the resulting underfill formed therefrom.

It should be further realized that the TFU polymer compositions of the present invention are useful for forming a variety of microelectronic device assemblies where a first substrate having a plurality of first contacts disposed over a first surface, for example a semiconductor die having electrical contact pads or through silicon via electrical contact pads disposed over a first surface, is electrically and physically coupled to a second substrate having a second plurality of contact pads disposed over a second surface, the first and second plurality of contact pads being at least substantially aligned with one another. The electrical and physical coupling being accomplished by providing solder preforms, for example solder balls, to individual contacts of one or both of the first and second plurality of contact pads, applying a TFU polymer composition to one or both of the first and second surfaces such that the TFU polymer composition encapsulates the solder preforms. Further to accomplishing the physical and electrical coupling, the first and second substrates brought into contact with one another through the layer of TFU polymer to form a preassembly structure which is then heated to a temperature that is effective to both allow for the solder preforms to form electrical coupling of the first and second plurality of contacts, but also be effective for the TFU polymer to encapsulate the solder preforms and physically couple the first substrate to the second substrate.

What is claimed is:
1. A polymer composition comprising:
   a polycarbonate having repeating units derived from a diol monomer of formula A, B or C:

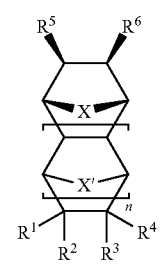

A

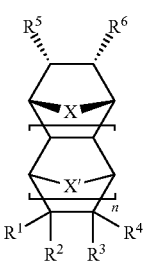

B

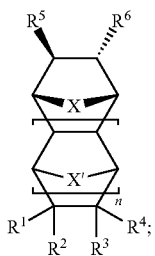

C and
a diol monomer selected from the group consisting of:

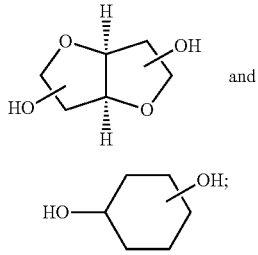

wherein n is independently 0, 1 or 2;
each of $R^1$, $R^2$, $R^3$ and $R^4$ is independently selected from hydrogen or a hydrocarbyl group;
each of $R^5$ and $R^6$ are independently selected from —(CH$_2$)$_p$—OH, where p is 0, 1, 2 or 3;
each of X and X' is independently selected from —CH$_2$—, —CH$_2$—CH$_2$— and —O—, where each X' is, if present, oriented the same or opposite the orientation of X; and where said polycarbonate having a molecular weight (Mw) from 5,000 to 300,000;
a carrier solvent;
and
a fluxing agent; and wherein said polymer is thermally stable in the temperature range from about 200° C. to 260° C. and provides for holding a microelectronic component at a desired position on a substrate and remaining in place as an underfill.

2. The polymer composition of claim 1, where p is 1, 2 or 3; and X and X' are independently —CH$_2$— or —CH$_2$—CH$_2$—.

3. The polymer composition of claim 1, where p is 1; n is 0 or 1; and X is —CH$_2$— or —CH$_2$—CH$_2$—; and X', if present, is —CH$_2$—.

4. The polymer composition of claim 1 where the fluxing agent is selected from formaldehyde, formic acid, 2-nitrobenzoic acid, malonic acid, citric acid, malic acid and succinic acid.

5. The polymer composition of claim 4, where the fluxing agent is formic acid.

6. The polymer composition of claim 1 where the polycarbonate formed from diol monomers is one of a 1,3-polycyclohexyl carbonate or a poly(isosorbyl carbonate).

7. The polymer composition of claim 6 where formic acid comprises from 0.5 to 10.0 wt. % based on the total weight of the polymer.

8. The polymer composition of claim 1 where the polycarbonate further comprises repeating units derived from norbornane diol monomers, norbornane dimethanol monomers represented by Formulae D1, D1', E1, E1', F1 and F1':

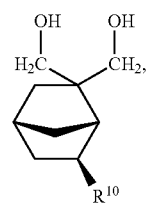

D1

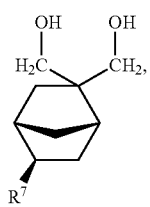

D1'

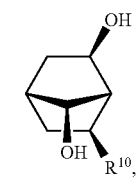

E1

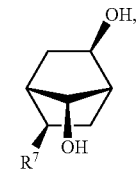

E1'

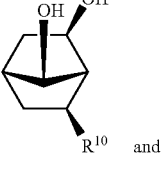

F1 and

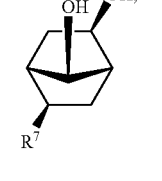

F1' where $R^7$ and $R^{10}$ are independently selected from alkyl, cycloalkyl, heteroalkyl, heterocycloalkyl, aryl, heteroaryl and aralkyl.

9. The polymer composition of claim 1 where the diol monomer of formula III is 1,3-cyclohexanediol.

10. The polymer composition of claim 1 where the diol monomer of formula XII is isosorbide.

11. The polymer composition of claim 1 where the polymer is 15 to 80 wt % of the polymer composition.

12. The polymer composition of claim 1 where the carrier solvent is selected from cyclohexanone, cyclopentanone, diethylene glycol dimethyl ether, gamma-butyrolactone (GBL), N,N-dimethylacetamide, N,N-dimethylformamide, anisole, acetone, methyl 3-methoxypropionate, tetrahydrofuran (THF) and mixtures thereof.

13. The polymer composition of claim 12, where the carrier solvent is GBL.

14. A method for forming a microelectronic component assembly comprising:
- providing a first substrate having first contact regions disposed over a first surface;
- providing a second substrate having second contact regions disposed over a second surface;
- providing solder preforms disposed over one or more of the first contact regions or one or more of the second contact regions;
- forming a layer of polymer film of the polymer composition of claim 1 overlying and encapsulating the solder preforms;
- contacting the first surface of the first substrate to the second surface of the second substrate where the layer of polymer is disposed therebetween, the first contact regions are aligned with the second contact regions and where a preassembly structure is formed; and
- heating the preassembly structure to a temperature effective to (1) cause the solder preforms to physically and electrically couple the one or more of the first contact regions to the one or more of the second contact regions and to (2) form a polymer underfill physically coupled to the first and second substrates.

15. The method of claim 14 where forming a layer of polymer overlying and encapsulating the solder preforms comprises forming such layer overlying an active surface of a microelectronic device having solder balls disposed on contact pads.

16. The method of claim 14 where said polymer composition comprises formic acid as the fluxing agent.

* * * * *